US008362776B2

(12) United States Patent
Chu et al.

(10) Patent No.: US 8,362,776 B2
(45) Date of Patent: Jan. 29, 2013

(54) APPARATUS FOR TUNING MAGNETIC RESONANCE COIL ELEMENTS AND METHOD OF MAKING SAME

(75) Inventors: Dashen Chu, Hartland, WI (US); Robert S. Stormont, Hartland, WI (US); Saban Kurucay, Menomonee Falls, WI (US); Scott A. Lindsay, Dousman, WI (US); Ricardo M. Matias, Brookfield, WI (US); Anthony D. Defranco, Pittsburgh, PA (US)

(73) Assignee: General Electric Company, Schenectady, NY (US)

( * ) Notice: Subject to any disclaimer, the term of this patent is extended or adjusted under 35 U.S.C. 154(b) by 588 days.

(21) Appl. No.: 12/570,807

(22) Filed: Sep. 30, 2009

(65) Prior Publication Data

US 2011/0074415 A1 Mar. 31, 2011

(51) Int. Cl.
*G01V 3/00* (2006.01)

(52) U.S. Cl. ........................................ 324/318; 324/322

(58) Field of Classification Search .......... 324/300–322; 600/407–445

See application file for complete search history.

(56) References Cited

U.S. PATENT DOCUMENTS

| | | | | |
|---|---|---|---|---|
| 5,657,022 | A * | 8/1997 | Van Etten et al. | 342/104 |
| 7,180,291 | B2 * | 2/2007 | Chmielewski et al. | 324/318 |
| 7,227,361 | B2 * | 6/2007 | Okamoto et al. | 324/318 |
| 7,408,351 | B2 * | 8/2008 | Yoshida | 324/318 |
| 7,501,824 | B2 * | 3/2009 | Kawachi et al. | 324/318 |
| 7,511,498 | B2 * | 3/2009 | Fujimoto et al. | 324/318 |
| 7,663,365 | B2 * | 2/2010 | Kanazawa | 324/309 |
| 7,847,549 | B2 * | 12/2010 | Takahashi et al. | 324/307 |

OTHER PUBLICATIONS

Hoult et al., "The Quantum Origins of the Free Induction Decay Signal and Spin Noise," Journal of Magnetic Resonance, vol. 148, 2001, pp. 182-199.

Smith et al., "Surface Coils with Integrated Differential Amplifiers," Proc. Intl. Soc. Mag. Reson. Med., vol. 14, 2006, p. 2618.

Ramirez et al., "Resonance Shift Decoupling: A Potential Alternative to Low Input Impedance Preamplifiers," Proc. Intl. Soc. Mag. Reson. Med., vol. 17, 2009, p. 103.

* cited by examiner

*Primary Examiner* — Brij Shrivastav

(74) *Attorney, Agent, or Firm* — Ziolkowski Patent Solutions Group, SC

(57) ABSTRACT

A method, system, and apparatus including a radio-frequency (RF) phased coil array for a magnetic resonance (MR) imaging apparatus that includes a first RF coil element tuned to a first frequency and configured to receive MR signals and a second RF coil element tuned to a second frequency different than the first frequency and configured to receive MR signals.

20 Claims, 4 Drawing Sheets

120 124 122 138 126 140 118 134 146 136 148 130 144 128 142 116

10
COMPUTER SYSTEM
CPU
MEMORY
20
IMAGE PROCESSOR 22
20a
24
26
34
18
12
14
16
13
40
SYSTEM CONTROL
CPU 36
PULSE GENERATOR 38
TRANSCEIVER 58
MEMORY 66
ARRAY PROCESSOR
68
32
32a
GRADIENT AMPS
$G_Z$ AMP
$G_Y$ AMP
$G_X$ AMP
42
PHYSIOLOGICAL ACQUISITION CONTROLLER
44
SCAN ROOM INTERFACE
46
PATIENT POSITIONING SYSTEM
48
PRE-AMPLIFIER
64
RF AMPLIFIER
60
T/R SWITCH
62
50
52
54
56

120
124
122
138
126
140
118
134
146
136
148
130
144
128
142
116

150

154
152
156
158
160

162
164
166
x=1
0.5
2
0.5
r=1
2
−0.5
−2

APPARATUS FOR TUNING MAGNETIC RESONANCE COIL ELEMENTS AND METHOD OF MAKING SAME

BACKGROUND OF THE INVENTION

Embodiments of the invention relate generally to magnetic resonance (MR) imaging and, more particularly, to reducing interference between MR coil elements of a phased array.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Often, a phased array is used during MR imaging. A phased array includes a plurality of radio-frequency (RF) coils or coil elements, and, conventionally, each RF coil element of the phased array is tuned to the same frequency. Generally, the resonance frequency of the system is chosen as the operating frequency of each coil element of the phased array. That is, the coil elements of the phased array are generally tuned to a frequency at which a whole-body transmit coil, transmit head, or the like operates to maximize reception. As such, the coil elements are at a resonant frequency with the whole-body RF coil or other transmit coil. Typically, coil elements tuned in this manner are "turned off" during operation of the MR system's transmit coil or other transmit coil to avoid resonance that can cause interference and degrade SNR and/or image quality.

RF coil elements of the array are generally configured or arranged to minimize interference, which can be caused by cross-talk between RF coil elements. For example, interference may be caused by inductive coupling, where one coil element inductively induces a current into an adjacent coil element. Inductive coupling becomes more predominant as coil density or coil channel count increases. Generally, inductive coupling tends to increase correlated noise between coil elements of an array. As such, the signal-to-noise ratio (SNR) of each coil generally degrades, thus degrading the performance of the RF coil array. Cross-talk interference may also be caused by inductive coupling between transmit and receive coils.

There are a variety of known techniques implemented to isolate cross-talking among coil elements. For example, to minimize cross-talking between adjacent coil elements, techniques that utilize critical or geometric coupling (e.g., minor overlap), inductive coupling, and capacitive coupling have been employed. However, geometric decoupling such as overlap, inductive coupling, and capacitive coupling can limit some effective geometric designs due to spatial constraints imposed by such techniques.

Another technique used to minimize cross-talk between non-adjacent coil elements employs low input impedance Pre-amplifiers (Pre-amps). The low input impedance Pre-amps are generally used to de-resonate each RF coil to reduce RF current of each coil and to reduce induced RF current between RF coils, thus improving isolation between coil elements of the array. With such techniques, RF coils are generally tuned to a resonance frequency (thus the need to de-resonate) and matched via a matching network to a 50-ohm output. The low input-impedance Pre-amp transforms the 50-ohm output to a high impedance around 1 k ohms to meet an optimum source impedance of the Pre-amps in order to yield a low noise figure for optimal SNR. However, low-input Pre-amps can generate limited blocking impedance due to stability concerns associated with the Pre-amps and coil size/loading dependency.

It would therefore be desirable to have a system and method capable of minimizing interference associated with RF coil elements of a phased array while overcoming the aforementioned drawbacks.

BRIEF DESCRIPTION OF THE INVENTION

In accordance with another aspect of the invention, a radio-frequency (RF) phased coil array for a magnetic resonance (MR) imaging apparatus includes a first RF coil element tuned to a first frequency and configured to receive MR signals, and a second RF coil element tuned to a second frequency different than the first frequency and configured to receive MR signals.

In accordance with another aspect of the invention, a method of manufacturing a magnetic resonance (MR) phased array includes forming a first MR coil element configured to operate at a first frequency and forming a second MR coil element configured to operate at a second frequency different than the first frequency.

In accordance with yet another aspect of the invention, a magnetic resonance (MR) coil array includes a plurality of MR phased array coil elements configured to receive MR signals. Each coil element of the plurality of MR phased array coil elements is configured to operate at a distinct operating frequency such that a first coil element of the plurality of MR phased array coil elements is configured to operate at a first frequency and such that a second coil element of the plurality of MR phased array coil elements is configured to operate at a second frequency different than the first frequency.

Various other features and advantages will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION

A system is shown to minimize interference among MR coil elements of a magnetic resonance (MR) coil array.

Figure 1:
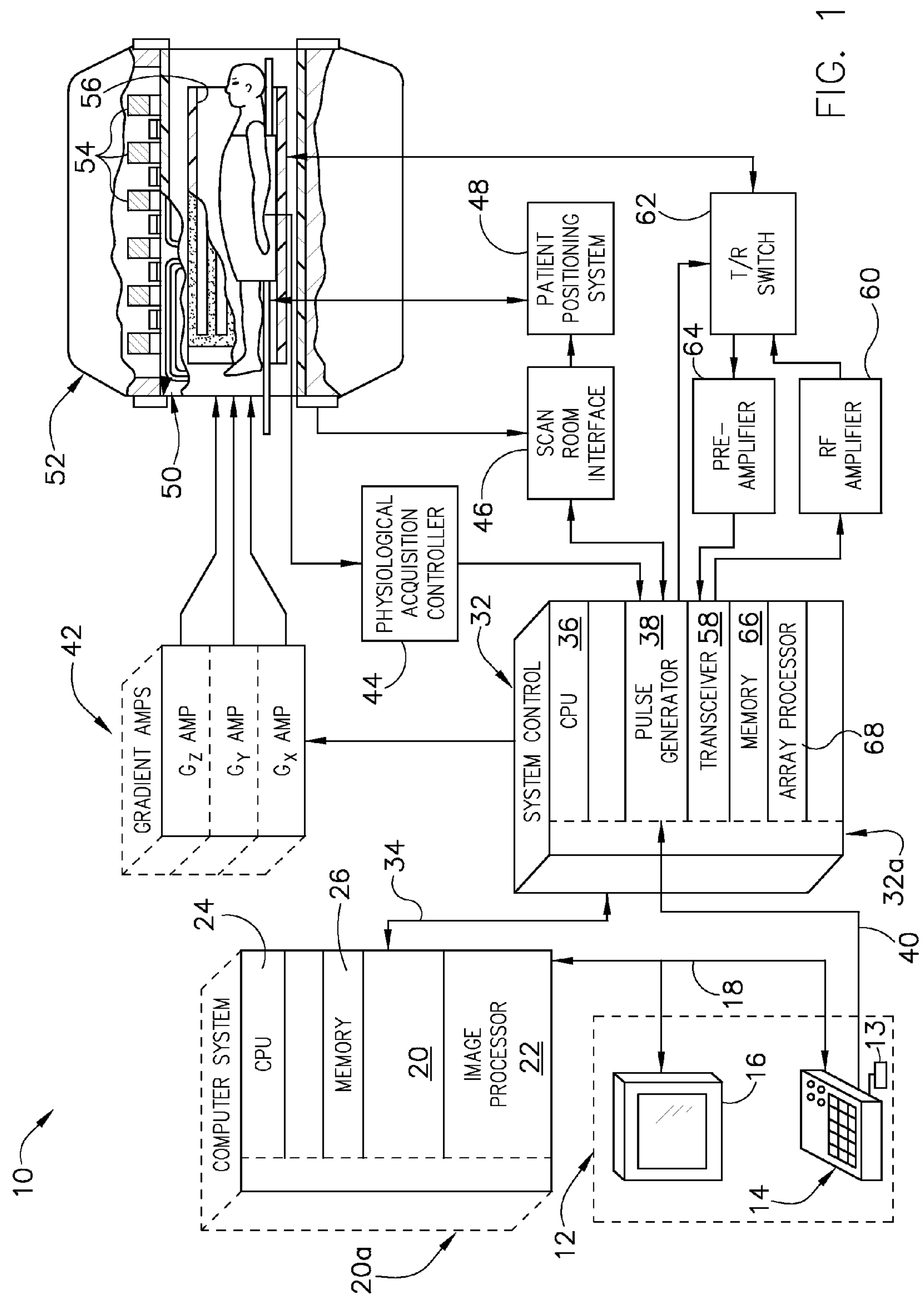
FIG. 1 is a schematic block diagram of an exemplary MR imaging system capable of use with embodiments of the present invention.

Referring to FIG. 1, the major components of a preferred magnetic resonance imaging (MRI) system 10 incorporating an embodiment of the invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20*a*. These include an image processor module 22, a CPU module 24 and a memory module 26, known in the art as a frame buffer for storing image data arrays. The computer system 20 communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32*a*. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a Pre-amplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the Pre-amplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

Figure 2:
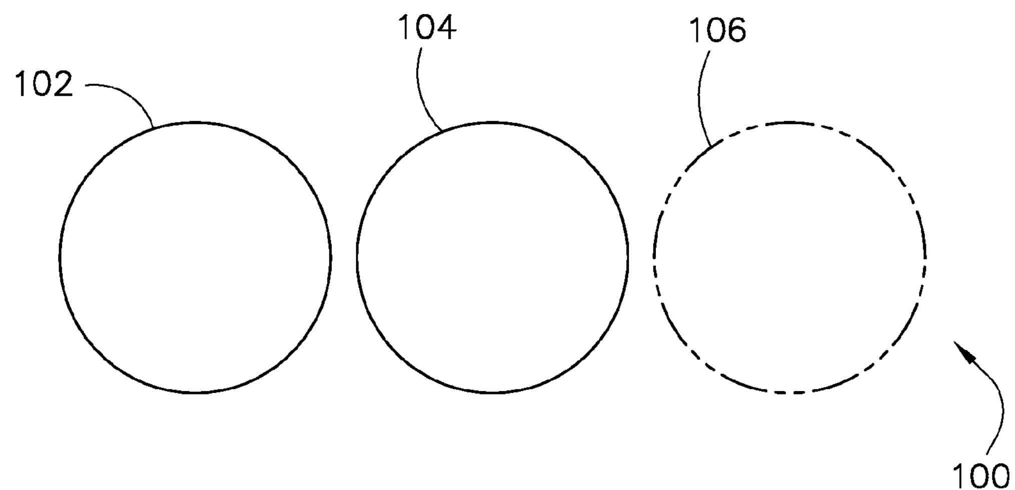
FIG. 2 is a schematic diagram of a phased array according to an embodiment of the invention.

Referring now to FIG. 2, a schematic representation of a phased array 100 is shown according to an embodiment of the invention. Phased array 100 includes a first MR or RF coil element 102 and a second MR or RF coil element 104. It is contemplated that phased array 100 may include one or more additional MR coil elements. For example, it is contemplated that MR phased array 100 or family of coil elements 102, 104 may include a third MR coil element 106 (shown in phantom). It is noted that the shapes of MR coil elements 102-106 shown are exemplary and that other MR coil element shapes are contemplated.

Still referring to FIG. 2, first MR coil element 102 is tuned to a first frequency, and second MR coil element 104 is tuned to a second frequency different than the first frequency. Accordingly, first MR coil element 102 and second MR coil element 104 are not resonant with one another, thus minimizing interference among one another 102, 104 during operation.

Phased array 100 is configured to be used in conjunction with an MR system such as MR system 10 of FIG. 1. It is contemplated that the first frequency and/or second frequency of first and second MR coil elements 102, 104 of FIG. 2, respectively, may be different than the operating frequency of a transmit coil (not shown). For example, if first and second MR coil elements 102, 104, respectively, were being utilized with an MR system such as MR system 10 of FIG. 1, it is contemplated that at least one of first and second MR coil elements 102, 104 of FIG. 2 be tuned to a frequency different than the operating frequency of whole-body RF coil 56 of FIG. 1. In other words, it is contemplated that at least one of first and second MR coil elements 102, 104 is tuned to a frequency non-resonant with the MR system's transmit coil (e.g., whole-body RF coil 56 of FIG. 1).

Accordingly, at least one of the first and second MR coil elements 102, 104, whether it be first MR coil element 102, second MR coil element 104, or both MR coil elements 102, 104, operating at a non-resonant frequency may operate simultaneously with the MR system's transmit coil. This is in contrast to a phased array having all MR coil elements are tuned to a resonant frequency with the MR system transmit coil.

With regard to third MR coil element 106, it is contemplated that third MR coil element 106 may be tuned to the first frequency, the second frequency, or to a third frequency different than each of the first and second frequencies. Likewise, additional MR coil elements (not shown) may be tuned such that each MR coil element of phased array 100 operates at a unique frequency. In the alternative, one or more of the additional MR coil elements may be tuned to operate at the first, second, or third frequency.

Figure 3:
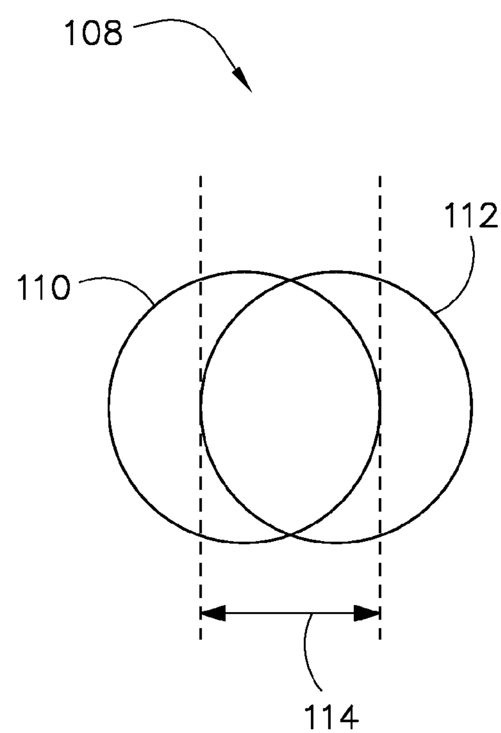
FIG. 3 is a schematic diagram of a phased array according to another embodiment of the invention.

Since first and second MR coil elements 102, 104 may be tuned to different frequencies, negative resonance effects are greatly reduced, thus enabling greater coil overlap geometries such as the overlap shown in FIG. 3.

FIG. 3 schematically depicts a phased array 108 having a first MR coil element 110 and a second MR coil element 112 tuned to different frequencies. Since resonance effects among first and second MR coil elements 110, 112 are avoided or at least minimized, first MR coil element 110 can overlap second MR coil element 112 in an exemplary overlapping region 114. It is contemplated that phased array 108 may include additional MR coil elements (not shown) arranged in a similar or different geometry than that shown among first and second MR coil elements 108, 110. Other coil geometries beside the geometry shown in FIG. 3 are contemplated.

Figure 4:
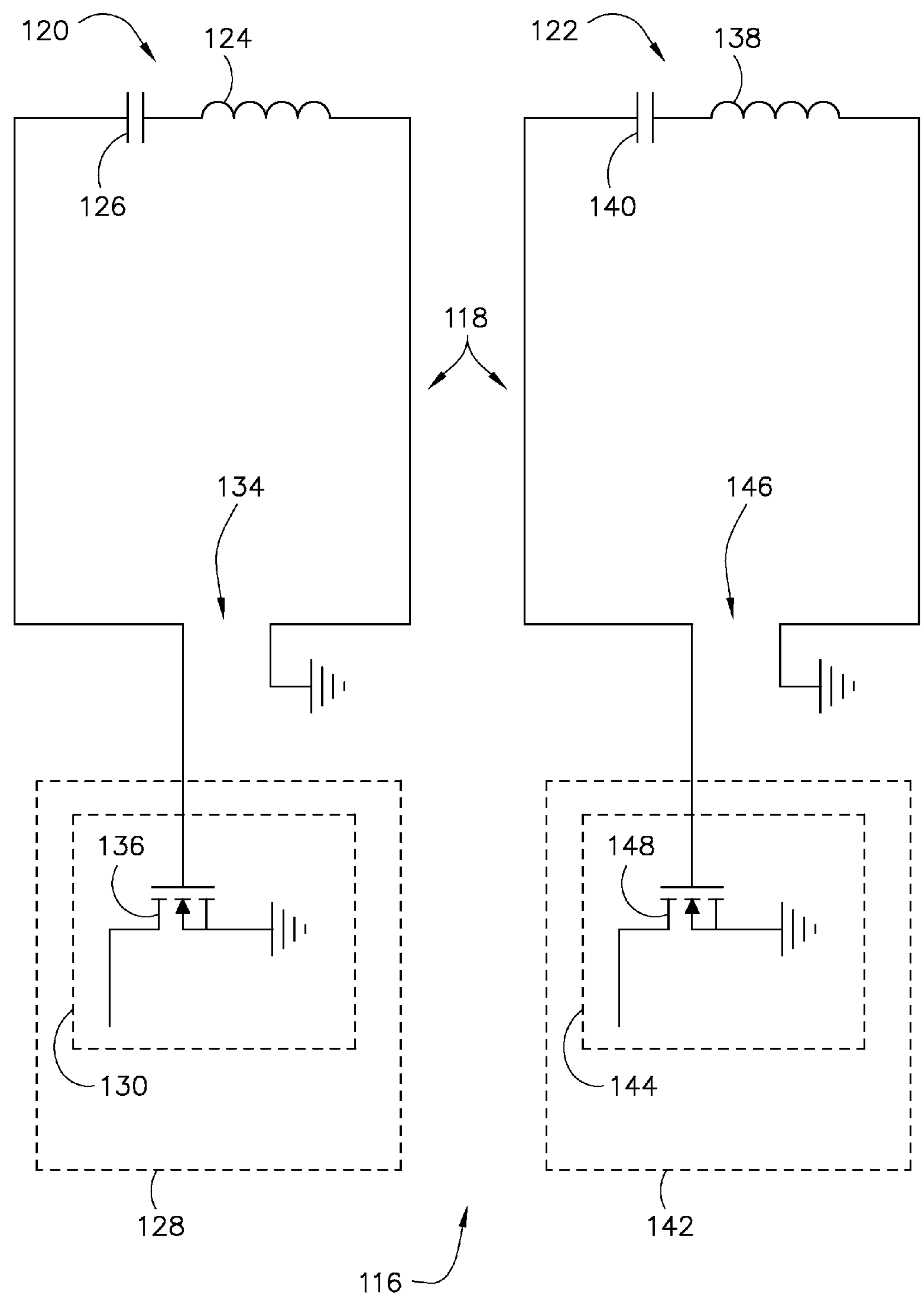
FIG. 4 is a circuit diagram of a phased array according to an embodiment of the invention.

Referring now to FIG. 4, a circuit diagram 116 of a phased array 118 is shown according to an embodiment of the invention. As shown in FIG. 4, a first MR coil element 120 and a second MR coil element 122 of phased array 118 are represented in circuit diagram 116. MR coil element 120 has an inductance 124 and a capacitor 126 (additional capacitors, not shown, may be included).

Circuit diagram 116 also depicts a first Pre-amplifier 128 having a high input Pre-amplifier first stage 130 that is directly coupled in series with first MR coil element 120. According to embodiments of the invention, a matching network (not shown) between high input Pre-amplifier first stage 130 and first MR coil element 120 is not employed. Often, such matching networks include an LC transformer coupled in parallel between the coil element and the Pre-amplifier. Due to the configuration shown in FIG. 4, however, the impedance of MR coil element 120 is directly fed to high input Pre-amplifier first stage 130 along a conductive path 134. According to embodiments of the invention, high input Pre-amplifier first stage 130 includes a high input impedance field-effect-transistor (FET) 136.

High input impedance FET 136 has a low source reflection coefficient, $\gamma$, and a low normalized noise resistance, $R_n$ in addition to a low noise figure. Preferably, high input impedance FET 136 has a source reflection coefficient of $\gamma$ substantially equal to 0.0 and a normalized noise resistance of $R_n$ substantially equal to 0.0. However, $\gamma$ values less than or equal to 0.1 and $R_n$ values less than or equal to 0.2 are also contemplated. With first coil high input impedance FET 136 having the appropriate $\gamma$ and $R_n$ values, high input Pre-amplifier first stage 130 provides a blocking impedance for MR coil element 120, while also providing a large noise circle in the context of a Smith Chart. As such, current in first MR coil element 120 is minimized, and a high input impedance of high input impedance FET 136 is effectively noise matched with the output impedance of first MR coil element 120 operating at a given frequency from a broad range of frequencies.

High input Pre-amplifier first stage 130 presents a broad band of low noise characteristics along with the high input impedance characteristic discussed above. In addition, due to a large noise circle, the noise figure of high input Pre-amplifier first stage 130 is low under various source loading conditions. Accordingly, the low noise figure enables first MR coil element 120 to be noise matched at off-resonance frequencies and on-resonance frequencies. That is, the large noise circle substantially encompasses the circle of the output impedance from MR coil element 120 over a large range of operating frequencies. The operating frequency of coil element 120 may be determined or manipulated by the capacitance size chosen for capacitor 126. Effectively, capacitor 126 is a tuning or tuned system.

Having a large noise circle, high input Pre-amplifier first stage 130 yields an effective SNR over a variety of RF coil impedances while producing a high blocking impedance to first MR coil element 120. In other words, the large noise circle of high input impedance FET 136 allows first MR coil element 120 to produce an effective SNR over a large range of operating frequencies. Accordingly, a matching network is not needed to produce an effective SNR.

Also represented in circuit diagram 116 is second MR coil element 122 having a second coil inductance 138 and a second coil capacitor 140. Similar to the configuration of first coil element 120 and first Pre-amplifier 128, a second Pre-amplifier 142 having a second high input Pre-amplifier first stage 144 is directly coupled to second MR coil element 122 along a second conductive path 146, without employing an intervening matching network. According to embodiments of the invention, second high input Pre-amplifier first stage 144 includes a second coil high input impedance FET 148. Similar to first coil high input impedance FET 136, second coil high input impedance FET 148 has a $\gamma$ value less than or equal to 0.1 and a normalized $R_n$ value less than or equal to 0.2. In one embodiment, second coil high input impedance FET 148 has a $\gamma$ value substantially equal to 0.0 and a normalized $R_n$ value substantially equal to 0.0.

With second high input impedance FET 148 having the appropriately low $\gamma$ and $R_n$ values, second high input impedance FET 148 provides a blocking impedance to second MR coil element 122, while also providing a large noise circle in the context of a Smith Chart. As such, current in second MR coil element 122 is minimized, and a high input impedance of second high input impedance FET 148 is effectively noise matched with the output impedance of second MR coil element 122 operating at a given frequency from a broad range of frequencies.

Similar to first high input Pre-amplifier first stage 130, second high input Pre-amplifier first stage 144 presents a broad band of low noise characteristics along with to the high input impedance characteristic discussed above. In addition, due to a large noise circle, the noise figure of high input Pre-amplifier first stage 144 is low under various source loading conditions. As such, the noise circle or figure of the output impedance from MR coil element 122 lies within, or at least substantially within, the large noise circle of FET 148 over a large range of operating frequencies of MR coil element 122. Accordingly, the low noise figure enables second MR coil element 122 to be noise matched at off-resonance frequencies and on-resonance frequencies. The operating frequency of coil element 122 may be determined or manipulated by the capacitance size chosen for capacitor 140. Effectively, capacitor 140 is a tuning system.

Having a large noise circle, second high input Pre-amplifier first stage 144 yields an effective SNR over a variety of RF coil impedances while producing the high blocking impedance to second MR coil element 122. As discussed above, the large noise circle of second high input impedance FET 148 allows second MR coil element 122 to produce an effective SNR over a large range of operating frequencies. Accordingly, a matching network is not needed to produce an effective SNR.

Due to the noise matching effect enabled by first and second high input impedance FETs 136, 148, both first and second MR coil elements 120, 122 can be tuned to a wide variety of operating frequencies without significantly effecting the representative SNR of each coil element 122, 148.

Further, first MR coil element 120 may be tuned to a different operating frequency than second MR coil element 122. Thus, interference caused by inductive coupling between first and second coil elements 122, 148 is avoided, or at least minimized, since resonance among first and second MR coil elements 120, 122 is avoided or at least minimized. Such an off-resonance tuning scheme enables virtually any geometry of coils (e.g., first and second MR coil elements 122, 148) to share the same imaging volume without causing significant cross-talk. For example, MR coil elements 120, 122 may be overlapped in a manner similar to overlap 114 shown in FIG. 3. Other degrees of greater or lesser overlap than overlap 114 are also contemplated. It is noted, however, that according to embodiments of the invention, MR coil elements 120, 122 of FIG. 4 need not overlap (e.g., see FIG. 2).

Further, embodiments of the invention enable first and second MR coil elements 120, 122 to be tuned to frequencies different than an operating frequency of a transmit coil such as, for example, whole-body coil 56 of FIG. 1, a transmit head coil (not shown), or a local extremity transmit coil (not shown). Accordingly first and/or second MR coil 120, 122 of FIG. 4 may be operated simultaneously with the particular transmit coil. The ability to transmit and receive simultaneously can improve SNR as well as image homogeneity.

Though not shown in FIG. 4, embodiments of the invention are contemplated that employ additional MR coils, where the additional coils may be tuned to resonant or off-resonant frequencies.

In addition, it is also contemplated that other embodiments employ a Pre-amplifier having a first stage different than high input Pre-amplifier first stages 136, 148, respectively, shown in FIG. 4.

Figure 5:
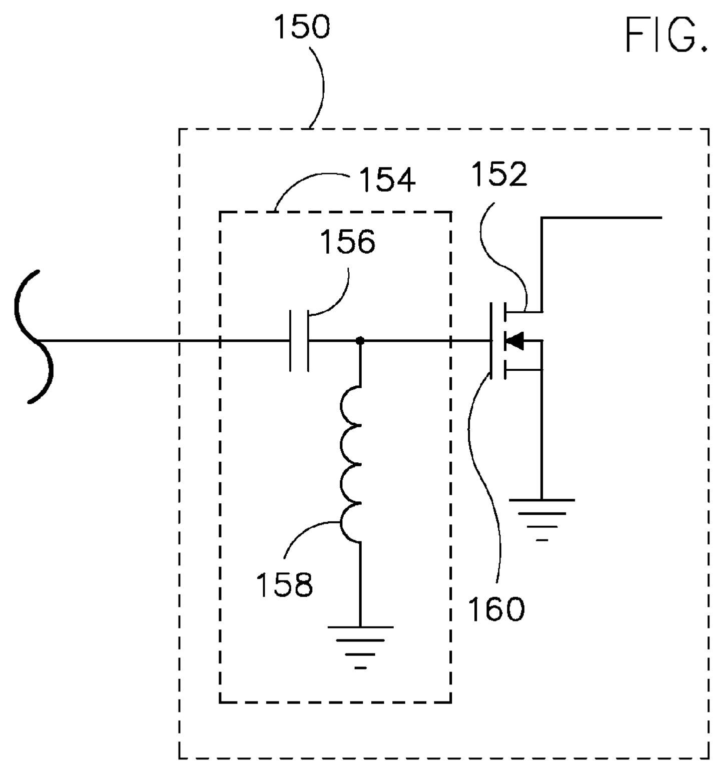
FIG. 5 is a circuit diagram of a portion of an exemplary Pre-amplifier capable of use with embodiments of the invention.

For example, referring to FIG. 5, a high input Pre-amplifier first stage 150 is shown according to another embodiment of the invention. High input Pre-amplifier first stage 150 includes a high input impedance FET 152 and a transformer 154. Similar to FETs 136, 148 shown in FIG. 4, high input impedance FET 152 of FIG. 5 has a low source reflection coefficient, $\gamma$, and a low normalized noise resistance, $R_n$. Preferably, high input impedance FET 152 has a source reflection coefficient of $\gamma$ substantially equal to 0.0 and a normalized noise resistance of $R_n$ substantially equal to 0.0. However, $\gamma$ values less than or equal to 0.1 and $R_n$ values less or equal to 0.2 are contemplated.

Transformer 154 includes a first capacitor 156 and a first inductor 158 and is configured to effectively cancel out a reactance of high input impedance FET 152. Such reactance may, for example, be caused by a parasitic capacitance effect resulting from a printed circuit board (PCB) layout of high input impedance FET 152 or by a gate 160 of high input impedance FET 152. Advantageously, configuring transformer 154 of high input Pre-amplifier first stage 150 to cancel, or to at least minimize, reactance maintains a high impedance (i.e., a blocking impedance) to the respective MR coil element (e.g., one of MR coil element 102-106 of FIG. 2 or one of MR coil element 110, 112 of FIG. 3) as well as an effective SNR without having a substantial impact on the noise figure of FET 152. Accordingly, the need for a matching network can be avoided. It is contemplated that high input Pre-amplifier first stage 150 may be employed with each coil element of a phased array (e.g., phased array 100).

Figure 6:
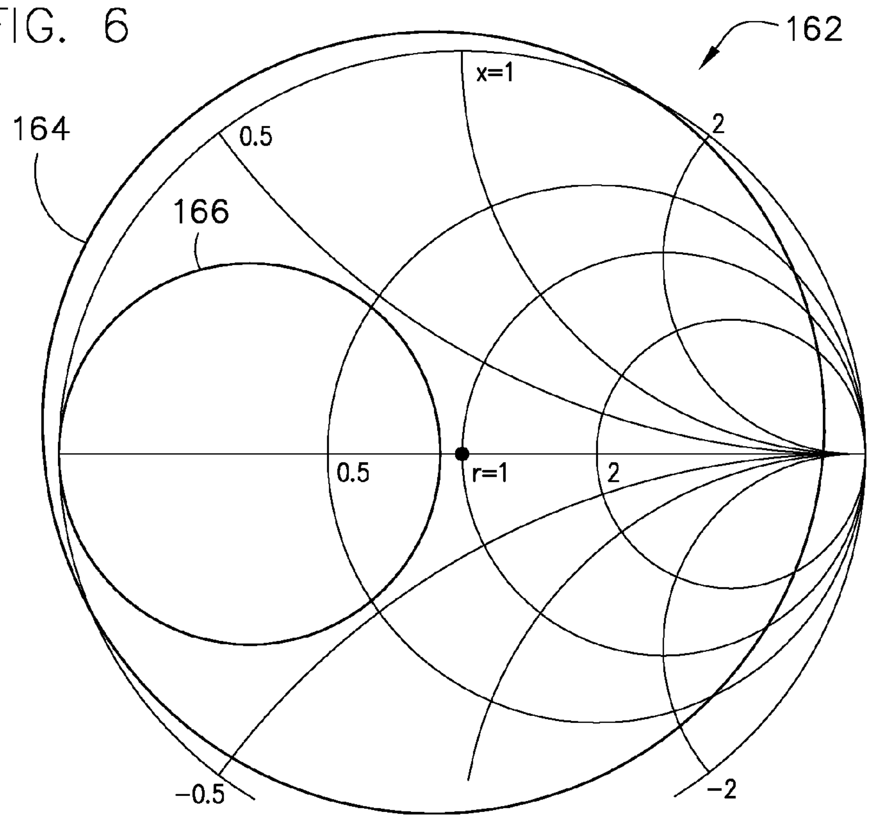
FIG. 6 is an exemplary Smith Chart depicting two exemplary noise figures according to an embodiment of the invention.

Referring now to FIG. 6, an exemplary Smith Chart 162 depicting noise match associated with embodiments of the invention are shown according to an embodiment of the invention. Smith Chart 162 includes a matched noise circle 164 of an exemplary high input FET (e.g., FETs 136, 148 of FIG. 4 or FET 152 of FIG. 5) and a source impedance circle 166 from an unmatched MR coil element (e.g., MR coil elements 120, 122 of FIG. 4) according to an embodiment of the invention. As shown, source impedance circle 166 (i.e., MR coil element output impedance) lies within matched noise circle 164 of an exemplary FET.

In accordance with one embodiment, a radio-frequency (RF) phased coil array for a magnetic resonance (MR) imaging apparatus includes a first RF coil element tuned to a first frequency and configured to receive MR signals, and a second RF coil element tuned to a second frequency different than the first frequency and configured to receive MR signals.

In accordance with another embodiment, a method of manufacturing a magnetic resonance (MR) phased array includes forming a first MR coil element configured to operate at a first frequency and forming a second MR coil element configured to operate at a second frequency different than the first frequency.

In accordance with yet another embodiment, a magnetic resonance (MR) coil array includes a plurality of MR phased array coil elements configured to receive MR signals. Each coil element of the plurality of MR phased array coil elements is configured to operate at a distinct operating frequency such that a first coil element of the plurality of MR phased array coil elements is configured to operate at a first frequency and such that a second coil element of the plurality of MR phased array coil elements is configured to operate at a second frequency different than the first frequency.

This written description uses examples to disclose embodiments of the invention, including the best mode, and also to enable any person skilled in the art to practice embodiments of the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A radio-frequency (RF) phased coil array for a magnetic resonance (MR) imaging apparatus comprising:

a first RF coil element tuned to a first frequency and configured to receive MR signals; and a second RF coil element tuned to a second frequency different than the first frequency and configured to receive MR signals.

2. The RF phased coil array of claim 1 further comprising:

a first conductive path having a first end coupled to the first RF coil element;

a first Pre-amplifier coupled to a second end of the first conductive path such that the first conductive path is free of a matching network intervening between the first MR coil element and the first Pre-amplifier;

a second conductive path having a first end coupled to the second RF coil element; and a second Pre-amplifier coupled to a second end of the second conductive path such that the second conductive path is free of a matching network intervening between the second MR coil element and the second Pre-amplifier.

3. The RF phased coil array of claim 1 further comprising:

a first RF coil circuitry coupled to the first RF coil element, wherein the first RF coil circuitry is free of a matching network, the first RF coil circuitry comprising a first high input impedance field-effect-transistor (FET) coupled in series to the first RF coil element; and a second RF coil circuitry coupled to the second RF coil element, wherein the second RF coil element is free of a matching network, the second RF coil circuitry comprising a second high input impedance FET coupled in series to the second RF coil element; and wherein an output impedance of the first RF coil element lies within a noise circle of the first high input impedance FET.

4. The RF coil phased array of claim 3 wherein the first and second high input impedance FETs have a source reflection coefficient that is one of substantially equal to 0.1 and less than 0.1 and a normalized reflection resistance that is one of substantially equal to 0.2 and less than 0.2.

5. The RF phased coil array of claim 4 wherein the first RF coil circuitry further comprises a first transformer coupled to the first high input impedance FET and configured to minimize a reactance of the first high input impedance FET.

6. The RF phased coil array of claim 5 wherein the first transformer comprises:

a first inductor; and a first capacitor.

7. The RF phased coil array of claim 1 wherein at least one of the first and second frequencies is different than an operating frequency of a transmit coil configured to elicit MR signals to be received by at least one of the first and second RF coil elements.

8. The RF phased coil array of claim 1 further comprising:

a third RF coil element tuned to a third frequency different than the first and second frequencies, wherein the first, second, and third frequencies are different than an operating frequency of a transmit coil configured to elicit MR signals to be received by the first, second, and third RF coil elements.

9. The RF phased coil array of claim 1 further comprising:

a first tuned system coupled to the first RF coil element and configured to tune the first MR coil element to the first frequency; the first tuned system comprising a first capacitor; and a second tuned system coupled to the second RF coil element and configured to tune the second MR coil element to the second frequency; the second tuned system comprising a second capacitor.

10. A method of manufacturing a magnetic resonance (MR) phased array:

forming a first MR coil element configured to operate at a first frequency; and forming a second MR coil element configured to operate at a second frequency different than the first frequency.

11. The method of claim 10 further comprising:

coupling a first stage of a first Pre-amplifier to the first MR coil element via a conductive path free of a matching network, the first stage of the first Pre-amplifier comprising a first field-effect-transistor (FET); and coupling a first stage of a second Pre-amplifier to the second MR coil element via a conductive path free of a matching network, the first stage of the second Pre-amplifier comprising a second FET.

12. The method of claim 11 wherein the first FET is configured to have a noise circle that at least substantially encompasses a noise figure of an output impedance from the first MR coil element.

13. The method of claim 11 wherein the first stage of the first Pre-amplifier further comprises a transformer configured to at least minimize a reactance of the first FET.

14. The method of claim 11 wherein the first FET has noise coefficient that is one of substantially equal to 0.1 and less than 0.1.

15. The method of claim 14 wherein the first FET has a normalized noise resistance that is one of substantially equal to 0.2 and less than 0.2.

16. The method of claim 10 wherein at least one of the first frequency and the second frequency is different than an operating frequency of a transmit coil configured to elicit MR signals to be received by at least one of the first and second MR coil elements.

17. A magnetic resonance (MR) coil array comprising:

a plurality of MR phased array coil elements configured to receive MR signals, wherein each coil element of the plurality of MR phased array coil elements is configured to operate at a distinct operating frequency such that a first coil element of the plurality of MR phased array coil elements is configured to operate at a first frequency and such that a second coil element of the plurality of MR phased array coil elements is configured to operate at a second frequency different than the first frequency.

18. The MR coil array of claim 17 further comprising:

a first Pre-amplifier coupled to the first coil element via a first conductive path free of a matching network that at least substantially matches an output impedance of the first coil element to an input impedance of the first Pre-amplifier; and a second Pre-amplifier coupled to the second coil element via a second conductive path free of a matching network that at least substantially matches an output impedance of the second coil element to an input impedance of the an output Pre-amplifier.

19. The MR coil array of claim 17 wherein at least one of the first and second frequencies is different than an operating frequency of a transmit coil element configured to elicit MR signals for reception by at least one of the first and second coil elements.

20. The MR coil array of claim 18 wherein a first Pre-amplifier comprises a high input impedance field-effect-transistor configured to have a noise circle that at least substantially surrounds the output impedance of the first coil element.

* * * * *